United States Patent
Lan et al.

(10) Patent No.: US 10,312,580 B1
(45) Date of Patent: Jun. 4, 2019

(54) CLASS OF NANOMATERIAL-BASED TUNABLE ANTENNAS

(71) Applicant: NORTHROP GRUMMAN SYSTEMS CORPORATION, Falls Church, VA (US)

(72) Inventors: Xing Lan, Huntington Beach, CA (US); Vesna Radisic, Manhattan Beach, CA (US); Robert Miles Young, Ellicott City, MD (US); Nabil A. El-Hinnawy, Irvine, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 20 days.

(21) Appl. No.: 15/839,456

(22) Filed: Dec. 12, 2017

Related U.S. Application Data

(60) Provisional application No. 62/447,642, filed on Jan. 18, 2017.

(51) Int. Cl.
| | |
|---|---|
| *B41J 2/01* | (2006.01) |
| *H01Q 1/38* | (2006.01) |
| *H01L 21/48* | (2006.01) |
| *H05K 3/00* | (2006.01) |
| *H03B 5/12* | (2006.01) |
| *H01L 23/538* | (2006.01) |

(52) U.S. Cl.
CPC .................. *H01Q 1/38* (2013.01); *B41J 2/01* (2013.01); *H01L 21/4867* (2013.01); *H01L 23/5382* (2013.01); *H03B 5/12* (2013.01); *H05K 3/007* (2013.01)

(58) Field of Classification Search
CPC ... H01Q 1/38; H01L 23/5382; H01L 21/4867; B41J 2/01; H05K 3/007
USPC .......................................................... 343/787
See application file for complete search history.

(56) References Cited

U.S. PATENT DOCUMENTS

| | | | | |
|---|---|---|---|---|
| 9,897,733 | B2* | 2/2018 | Han | G03H 1/2294 |
| 9,904,077 | B2* | 2/2018 | Park | B82Y 20/00 |
| 9,927,559 | B2* | 3/2018 | Li | G02B 5/0257 |
| 9,958,609 | B2* | 5/2018 | Lee | B05D 3/007 |
| 2017/0223838 | A1 | 8/2017 | Lan et al. | |

* cited by examiner

*Primary Examiner* — Brian K Young
(74) *Attorney, Agent, or Firm* — John A. Miller; Shumaker, Loop & Kendrick, LLP

(57) ABSTRACT

A tunable antenna structure including a substrate and at least one radiating element configured on the substrate. The antenna structure further includes a plurality of nanomaterial-based phase changing material (PCM) switches configured in the radiating element so that current flowing through the radiating element passes through the PCM switches. The antenna structure also includes a heating device, such as a laser or a resistive heater, configured relative to the PCM switches and being operable to selectively heat the PCM switches to switch the PCM switches between an on crystalline state and an off amorphous state, where once the heat is removed, the PCM switch remains in the particular state.

20 Claims, 4 Drawing Sheets

US 10,312,580 B1

CLASS OF NANOMATERIAL-BASED TUNABLE ANTENNAS

CROSS-REFERENCE TO RELATED APPLICATIONS

This application claims the benefit of the priority date of U.S. Provisional Patent Application Ser. No. 62/447,642, titled, Class of Nanomaterial-Based Tunable Antennas, filed Jan. 18, 2017.

BACKGROUND

Field

This invention relates generally to tunable antennas employing nanomaterial-based phase change material (PCM) switches and, more particularly, to tunable antennas that employ one or more PCM switches that are switched between a crystalline on state and an amorphous off state using a heating device to change the frequency band, polarization and/or radiation pattern of the antenna.

Discussion

Antennas that are employed for radio frequency (RF) purposes, such as satellite communications, radar systems, etc., are configured in a variety of well known types and designs for a particular application. Typically, all of the antennas employed for communications purposes are static antennas in their configuration and performance in that they are designed for a specific frequency band, polarization, radiation beam coverage and center operating frequency that cannot be changed. For those communications systems that may require transmission and reception over multiple frequency bands and/or different polarizations, multiple sets of static antennas are required, where each antenna is designed for a specific frequency band and a specific polarization, and where the antennas are switched in and out of the system through a switching network. Because certain communications systems require multiple antennas, various obvious drawbacks are present, such as increased cost, increased antenna size, increased antenna weight, increased antenna development time, etc. Thus, it would be desirable to provide a tunable antenna whose frequency band, polarization and/or radiation pattern could be changed in real time.

DETAILED DESCRIPTION OF THE EMBODIMENTS

The following discussion of the embodiments of the invention directed to a tunable antenna including PCM switches that are controlled to change the antennas frequency is merely exemplary in nature, and is in no way intended to limit the invention or its applications or uses.

Figure 1:
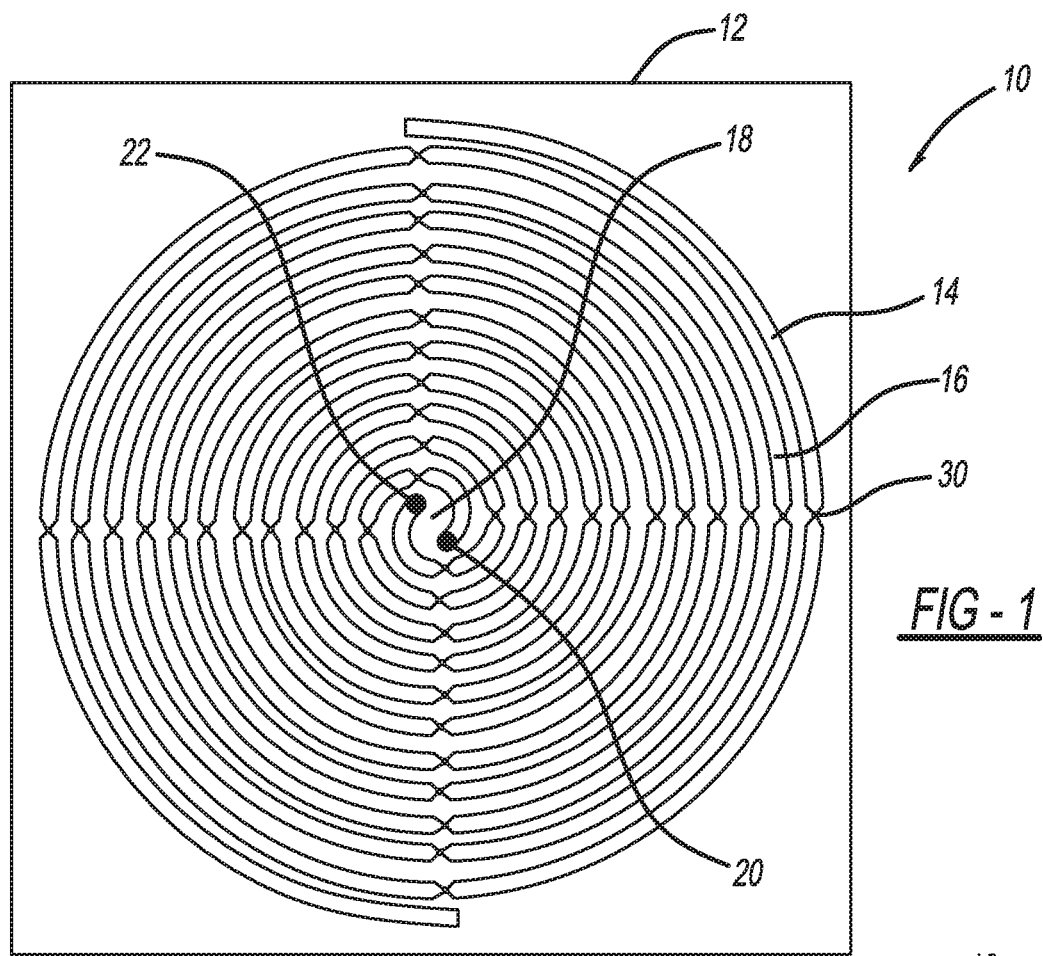
FIG. 1 is a top view of a spiral antenna including two Archimedean spiral arm radiating elements having PCM switches.

FIG. 1 is a top view of a spiral antenna 10 fabricated on a substrate 12, where the antenna 10 includes two Archimedean spiral arm radiating elements 14 and 16 spiraling out from a center area 18. Each radiating element 14 and 16 includes a center feed point 20 and 22, respectively, at the center area 18 where the radiating elements 14 and 16 are fed. The length of the radiating elements 14 and 16, the width of the radiating elements 14 and 16, the spacing between the radiating elements 14 and 16, etc. are all selected for a particular frequency band. Although the radiating elements 14 and 16 are shown as metal lines in this embodiment, other embodiments may employ complementary slot lines.

A number of PCM switches 30 are embedded in the radiating elements 14 and 16 at certain locations to change the operating frequency band of the antenna 10, where the switches 30 can be turned on and off to change the length of the spiral radiating elements 14 or 16, and where reducing the length of the radiating elements 14 or 16 increases the operating frequency of the antenna 10. Thus, by controlling the switches 30, the effective bandwidth of the antenna 10 can be controlled in real time. FIG. 1 shows a PCM switch 30 every 90° along each radiating element 14 and 16. However, this is by way of a non-limiting example in that the configuration of the switches 30 can be changed from one design to another design. Further, although providing symmetrical locations of the switches 30 in the antenna 10 may provide greater effective bandwidth control, the switches 30 can be placed at any suitable location along the arms.

Figure 2:
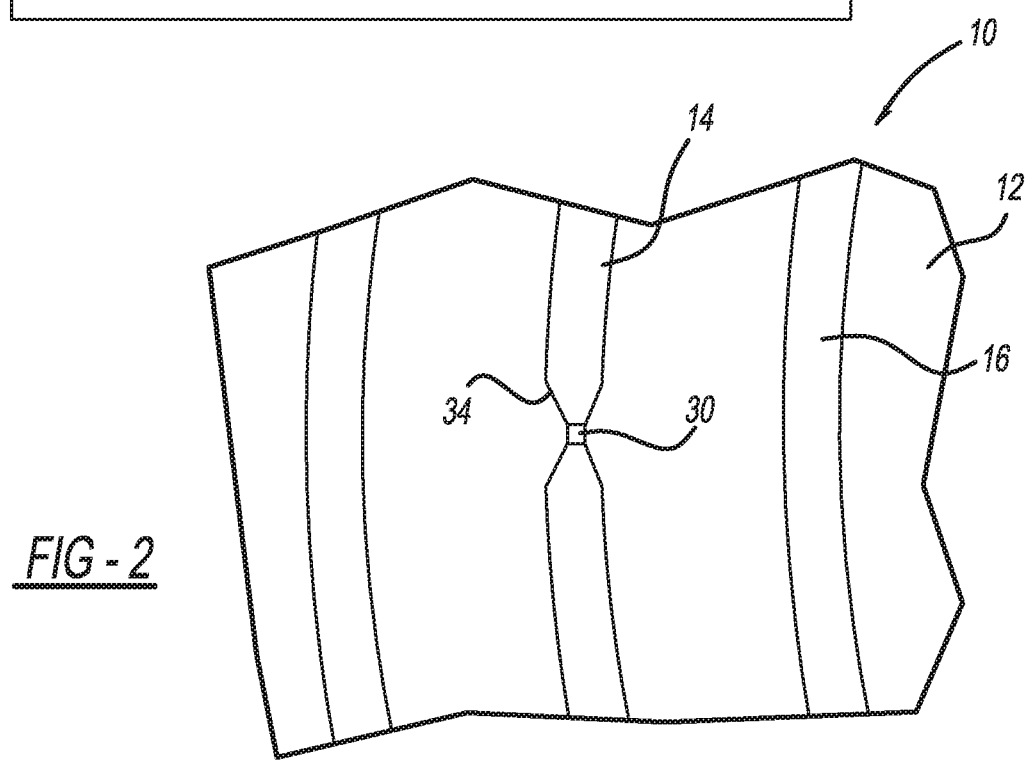
FIG. 2 is a blown-up view of a portion of the antenna shown FIG. 1 depicting one of the PCM switches.

FIG. 2 is a blown-up view of a portion of the antenna 10 showing one of the PCM switches 30 embedded in an indented portion 34 of the radiating element 14. As will be discussed in detail below, the switches 30 are composed of a phase changing nanomaterial, such as GeTe, AgInTe, $VO_2$, etc. These materials can change states from a highly conductive crystalline state to a non-conductive amorphous insulating state, and vice a versa, under proper thermal activation. Thus, a single antenna with embedded PCM switches can be dynamically programmed to configure the antenna aperture into numerous agile frequency bands and center frequencies, which will significantly reduces antenna size, weight, development time and cost required for frequency agile electronic applications.

Figure 3:
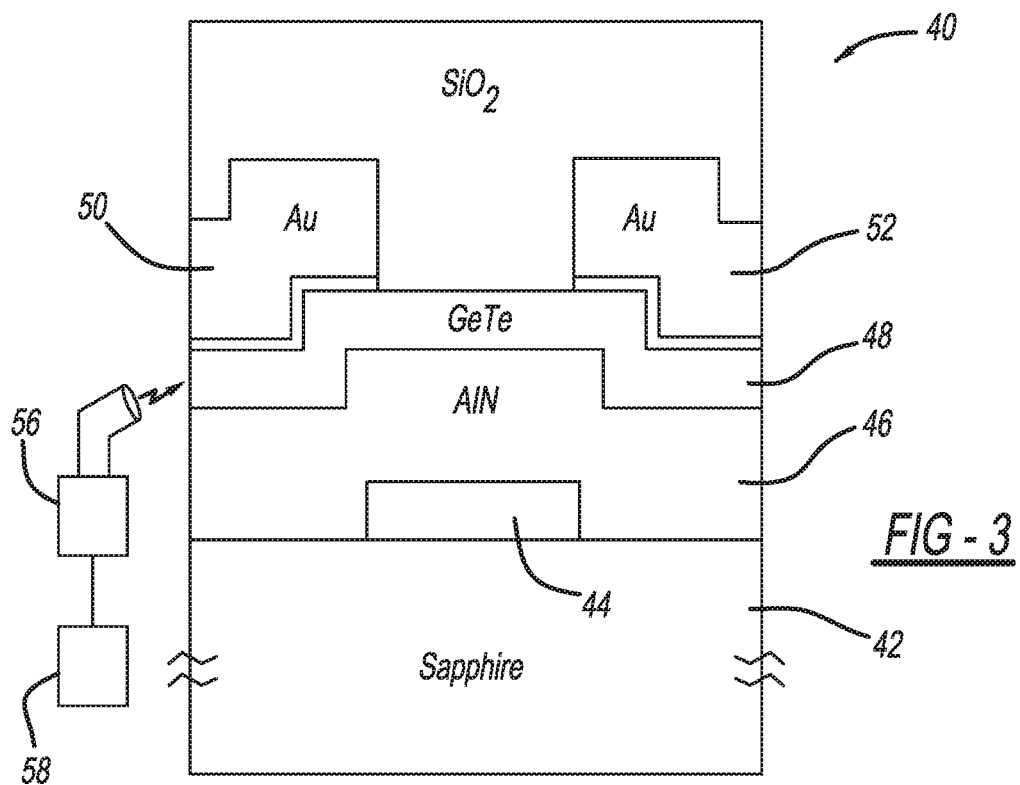
FIG. 3 is a profile view of a PCM switch of the type that can be used in the antenna shown in FIG. 1.

FIG. 3 is a profile view of an exemplary PCM switch 40 that can be employed as the switches 30, although other variations may be applicable within the scope of the present invention. The various layers and elements in the switch 40 are deposited by any suitable semiconductor fabrication process, including an aerosol ink jet printing process, well understood by those skilled in the art. The switch 40 includes a substrate 42, which is sapphire in this non-limiting example, on which is deposited a resistive heater 44 to a thickness of, for example, 50 nm that operates to change the state of a nanomaterial, as will be discussed in detail below.

A barrier layer 46, here AlN, is also deposited on the substrate 42 and around the heater 44 to a thickness of, for example, 100-150 nm. A PCM layer 48, here GeTe, is deposited on the barrier layer 46 to a suitable thickness, such as 50 nm for the particular application. The heater 44 operates to heat the PCM layer 48 to change the PCM layer 48 between a crystalline on state and an amorphous off state. A pair of gold contacts 50 and 52 are deposited on the PCM layer 48 to a thickness of, for example, 130 nm, and are spaced apart such that when the PCM layer 48 is in its crystalline on state, electrical current can flow through the PCM layer 48 between the contacts 50 and 52. A protective insulator layer 54, such as $SiO_2$, is deposited over the contacts 50 and 52 and the PCM layer 48 to a thickness of, for example, 200 nm, as shown.

Although the PCM layer 48 is heated by the resistive heater 44 to switch its state in this example, other ways of heating the PCM switch 40 may also be applicable in different embodiments. For example, a laser beam source 56 controlled by a laser controller 58 may be employed that emits a laser beam onto the PCM layer 48 to increase its temperature. The laser beam source 56 can be any suitable laser beam source for the purposes discussed herein. Any suitable configuration of one or more laser sources can be provided depending on the particular application.

Figure 4:
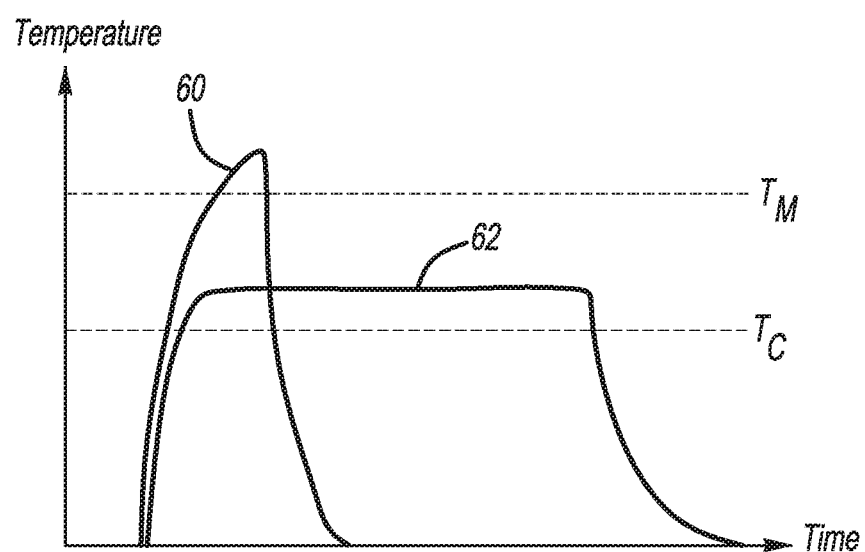
FIG. 4 is a graph with time on the horizontal axis and temperature on the vertical axis showing a thermal heating and switching profile for a PCM switch.

FIG. 4 is a graph with time on the horizontal axis and temperature on the vertical axis showing how the state of PCMs can be changed between the crystalline on state and the amorphous off state through heat activation. If the PCM is in the crystalline on state and it is desired to shut the switch 40 off, then the PCM is rapidly heated with a quenching signal above its melting temperature $T_m$ for a short period of time as shown by heating profile line 60, where the crystals in the material freeze in their amorphous state and remain in that configuration after the heat is removed and the temperature of the material falls. When switching from the amorphous off state to the crystalline on state, the PCM that is now frozen in the amorphous state is gently heated along the heating profile line 62 above the crystalline temperature $T_c$ of the material, but below its melting temperature $T_m$ for a certain period of time to return the material to its crystalline state, where when the heat is removed, the switch 40 remains in its crystalline state.

In one non-limiting embodiment, when switching from the crystalline on state to the amorphous off state, a 5 V signal is applied to the heater 44 for 100 ns and for switching from the amorphous off state to the crystalline on state, a 2.7 V signal is applied to the heater 44 for 1.5 µs. The ratio of the resistance $R_{off}$ of the switch 40 in the amorphous off state to the resistance $R_{on}$ of the switch 40 in the crystalline on state is typically greater than $10^5$ and the on resistance $R_{on}$ for a 1 µm×30 µm device is about 1Ω, which is suitable for numerous RF, microwave and millimeter wave applications. In this manner, the PCM switch 40 is non-volatile, where no power is needed to maintain the on or off state.

Figure 5:
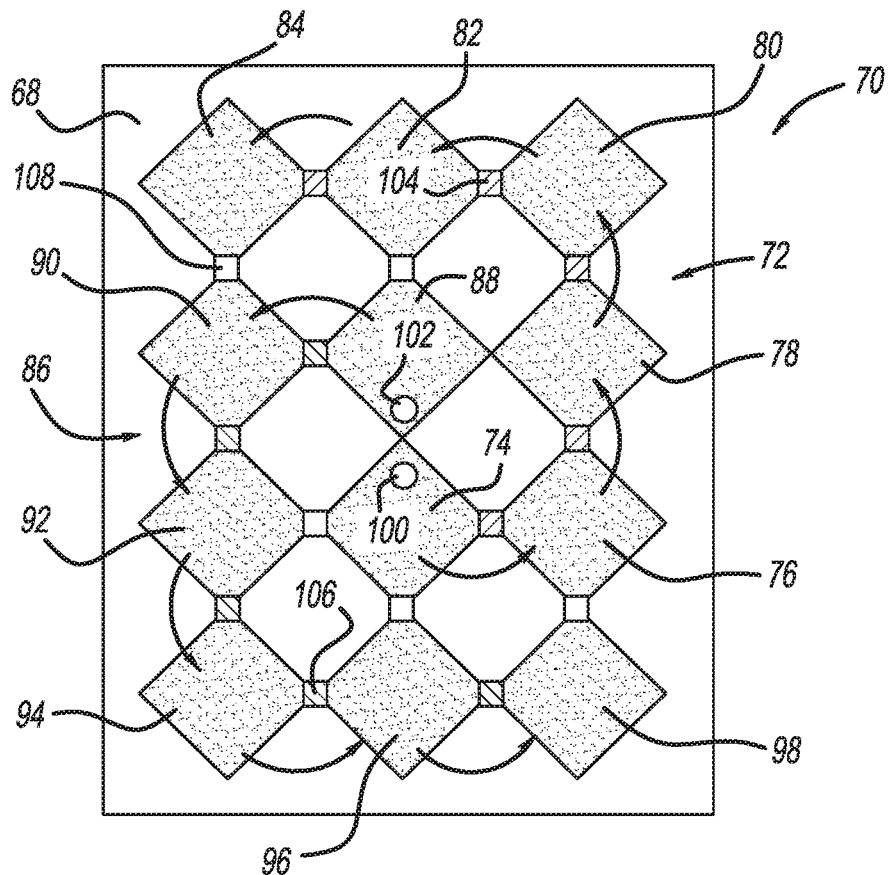
FIG. 5 is a top view illustration of spiral antenna including patch antenna elements and PCM switches.

The spiral arm antenna shown in FIG. 1 is merely one type of antenna structure that could benefit from employing the PCM switches of the invention as discussed herein. FIG. 5 is an illustration of a reconfigurable antenna array 70 that shows another example. The antenna array 70 includes a substrate 68 on which is deposited a first spiral radiating element 72 including patch antenna elements 74, 76, 78, 80, 82 and 84, and a second spiral radiating element 86 including patch antenna elements 88, 90, 92, 94, 96 and 98 electrically coupled as shown. The radiating element 72 is fed at feed point 100 and the radiating element 86 is fed at feed point 102. A separate PCM switch is provided between adjoining antenna elements 74, 76, 78, 80, 82, 84, 88, 90, 92, 94, 96 and 98, as shown. This configuration of the radiating elements 72 and 86 is a linear dipole array having circular polarization, where the switches are controlled to switch in certain ones of the antenna elements 74, 76, 78, 80, 82, 84, 88, 90, 92, 94, 96 and 98 to control the desired polarization pattern, specifically, right-hand circular polarization (RHCP), left-hand circular polarization (LHCP), vertical polarization or horizontal polarization. In this example, for the radiating element 72 connected to the feed point 100, a closed switch 104 coupling the antenna elements 74, 76, 78, 80, 82 and 84 is indicated by slash lines from the lower left to the upper right, and for the radiating element 86 connected to the feed point 102, a closed switch 106 coupling the antenna elements 88, 90, 92, 94, 96 and 98 is indicated by slash lines from the lower right to the upper left. Open switches 108 are indicated by no slash lines.

Figure 6:
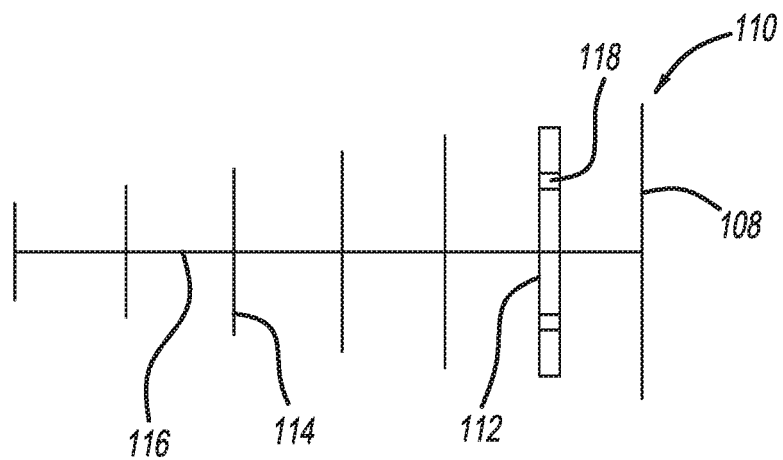
FIG. 6 is a top view of a Yagi-Uda antenna including PCM switches.

FIG. 6 is a top view of a planar Yagi-Uda antenna 110 including a reflector element 108, a radiating element 112 and a number of director elements 114 all attached to a cross-element 116. A number of PCM switches 118 are provided in the radiating element 112, where the length of the radiating element 112 can be changed for different frequency bands in the manner as discussed herein. PCM switches can also be provided in the reflector element 108 and the director elements 114 for this purpose.

Figure 7:
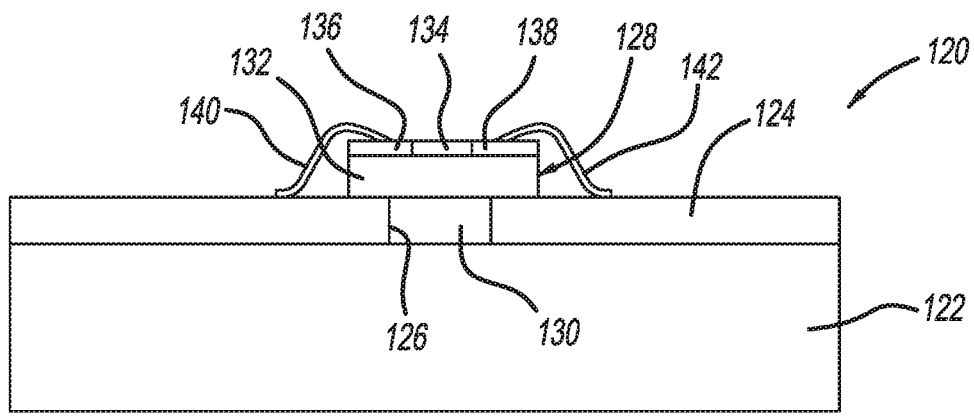
FIG. 7 is a side profile view of an antenna structure including a PCM chip and wire or ribbon bond connections.

Each PCM switch 30 can be electrically coupled to the radiating elements in any suitable manner. FIG. 7 is a profile view of an antenna structure 120 showing one design that employs wire bonds or ribbon bonds. The antenna structure 120 includes an antenna dielectric substrate 122 on which is deposited a conductive antenna radiating element 124 that includes an open section 126. A PCM switch chip 128 is positioned on the radiating element 124 so that it crosses the section 126 and is secured to the substrate 122 by an adhesive 130. The chip 128 includes a substrate 132, such as silicon carbide, on which is deposited a PCM layer 134. Contacts 136 and 138 are also deposited on the substrate 132 and are electrically coupled to the PCM layer 134. A first wire bond 140 is electrically coupled to the contact 136 and the radiating element 124 on one side of the section 126 and a second wire bond 142 is electrically coupled to the contact 138 and the radiating element 124 on the opposite side of the section 126. Thus, current flowing through the radiating element 124 must travel through the PCM layer 134.

Figure 8:
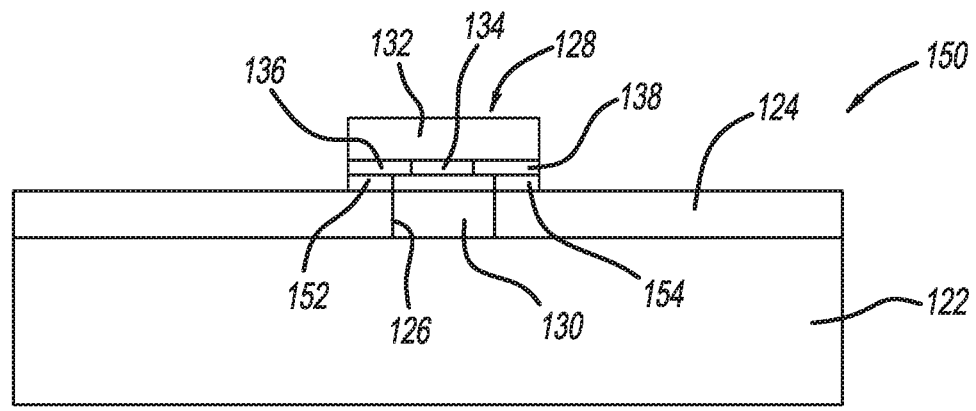
FIG. 8 is a side profile view of an antenna structure including a PCM flip chip and PCM contacts.

FIG. 8 is a profile view of an antenna structure 150 similar to the antenna structure 120, where like elements are identified by the same reference number. In this design, the PCM chip 128 is flipped over where PCM layers 152 and 154 are employed to electrically couple the contacts 136 and 138, respectively, to the radiating element 124, as shown.

Figure 9:
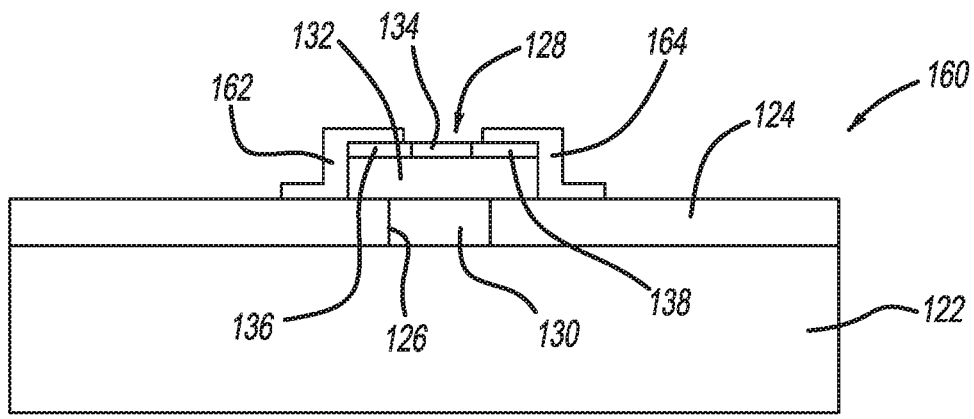
FIG. 9 is a side profile view of an antenna structure including a PCM switch having a printed PCM chip interconnects.

FIG. 9 is a profile view of an antenna structure 160 similar to the antenna structures 120 and 150, where like elements are identified by the same reference number. In this embodiment, instead of employing the wire bonds, three-dimensional printed interconnects 162 and 164 provide electrical contact between the radiating element 124 and the contacts 136 and 138. Any suitable printing process can be employed, such as aerosol ink jet printing well understood by those skilled in the art.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An antenna structure comprising:
   a substrate;
   at least one radiating element configured on the substrate;
   at least one nanomaterial-based phase changing material (PCM) switch configured in the at least one radiating element so that current flowing through the radiating element selectively passes through the PCM switch; and
   a heating device configured relative to the PCM switch and being operable to selectively heat the phase changing material to switch the PCM switch between a crystalline on state that allows the current flow through the PCM switch and an amorphous off state that prevents the current flow through the PCM switch, where the PCM switch remains in the particular crystalline or amorphous state when the heat is removed.

2. The antenna structure according to claim 1 wherein the at least one PCM switch is configured in the at least one radiating element to change a frequency band, polarization and/or radiation pattern of the antenna structure.

3. The antenna structure according to claim 1 wherein the at least one PCM switch is a plurality of PCM switches positioned along the at least one radiating element so as to change the length of the radiating element for different frequency bands.

4. The antenna structure according to claim 1 wherein the at least one radiating element is at least one spiral radiating element.

5. The antenna structure according to claim 4 wherein the at least one spiral radiating element is at least one Archimedean spiral arm.

6. The antenna structure according to claim 5 wherein the at least one Archimedean spiral arm is two Archimedean spiral arms having corresponding antenna feed points at a center of the spiral arms.

7. The antenna structure according to claim 1 wherein the antenna structure is a linear dipole antenna array having circular polarization, and wherein the at least one radiating element is a first spiral radiating element including a plurality of electrically coupled patch elements and a second spiral radiating element including a plurality of electrically coupled patch elements, and wherein the at least one PCM switch is a plurality of PCM switches that electrically couple the patch antenna elements.

8. The antenna structure according to claim 1 wherein the antenna structure is a Yagi-Uda antenna.

9. The antenna structure according to claim 1 wherein the heating device is a laser.

10. The antenna structure according to claim 1 wherein the heating device is a resistive heater.

11. The antenna structure according to claim 1 wherein the at least one PCM switch is electrically coupled to the radiating element by wire or ribbon bonds.

12. The antenna structure according to claim 1 wherein the at least one PCM switch is electrically coupled to the radiating element by PCM contacts.

13. The antenna structure according to claim 1 wherein the at least one PCM switch is electrically coupled to the radiating element by three-dimensional printed interconnects.

14. The antenna structure according to claim 1 wherein the phase changing material is GeTe.

15. An antenna structure comprising:
    a substrate;
    two Archimedean spiral arm radiating elements having corresponding antenna feed points at a center of the spiral arm radiating elements and being configured on the substrate; and
    a plurality of spaced apart nanomaterial-based phase changing material (PCM) switches configured in both of the radiating elements so that current flowing through the radiating elements selectively passes through the PCM switches, each PCM switch including a resistive heating device being operable to selectively heat the phase changing material to switch the PCM switch between a crystalline on state and an amorphous off state, where the PCM switch remains in the particular state when the heat is removed.

16. The antenna structure according to claim 15 wherein the plurality of PCM switches are configured in the radiating elements to change a frequency band, polarization and/or radiation pattern of the antenna structure.

17. The antenna structure according to claim 15 wherein the phase changing material is GeTe.

18. A linear dipole antenna array having circular polarization comprising:
    a substrate;
    a first spiral radiating element including a plurality of electrically coupled patch elements and a second spiral radiating element including a plurality of electrically coupled patch elements; and
    a plurality of spaced apart nanomaterial-based phase changing material (PCM) switches configured to electrically couple the patch antenna elements so that current flowing through the patch antenna elements selectively passes through the PCM switches, each PCM switch including a resistive heating device being operable to selectively heat the phase changing material to switch the PCM switch between a crystalline on state and an amorphous off state, where the PCM switch remains in the particular state when the heat is removed.

19. The antenna array according to claim 18 wherein the plurality of PCM switches are configured in the radiating elements to change a frequency band, polarization and/or radiation pattern of the antenna array.

20. The antenna array according to claim 18 wherein the phase changing material is GeTe.

* * * * *